(12) United States Patent
Neuendorf et al.

(10) Patent No.: US 10,487,774 B2
(45) Date of Patent: Nov. 26, 2019

(54) POWER GENERATOR FOR PISTON INSTRUMENTATION

(71) Applicant: FEDERAL-MOGUL CORPORATION, Southfield, MI (US)

(72) Inventors: Jonathan Owen Neuendorf, Ann Arbor, MI (US); Patrick Gyetvay, Allen Park, MI (US); Ross Gladwin, Ann Arbor, MI (US)

(73) Assignee: Tenneco Inc., Lake Forest, IL (US)

( * ) Notice: Subject to any disclaimer, the term of this patent is extended or adjusted under 35 U.S.C. 154(b) by 754 days.

(21) Appl. No.: 14/743,221

(22) Filed: Jun. 18, 2015

(65) Prior Publication Data

US 2016/0123272 A1 May 5, 2016

Related U.S. Application Data

(60) Provisional application No. 62/072,520, filed on Oct. 30, 2014.

(51) Int. Cl.
*F02F 3/16* (2006.01)
*H01L 35/32* (2006.01)
(Continued)

(52) U.S. Cl.
CPC .............. *F02F 3/16* (2013.01); *F02F 3/00* (2013.01); *G01K 13/06* (2013.01); *H01L 35/02* (2013.01);
(Continued)

(58) Field of Classification Search
CPC ...... F02F 3/16; F02F 3/00; G01K 3/06; H01L 35/32
See application file for complete search history.

(56) References Cited

U.S. PATENT DOCUMENTS 5,106,202 A    4/1992  Anderson et al.
6,866,011 B1 *  3/2005  Beardmore .............. F01M 1/08
                                            123/41.35
(Continued)

FOREIGN PATENT DOCUMENTS

JP    S61110851 U    7/1986
JP    S61196399 U    12/1986
(Continued)

OTHER PUBLICATIONS

Shi, Y., Deng, Y., Gao, H., Lin, Z., Zhu, W., & Ye, H. (2014). A novel self-powered wireless temperature sensor based on thermoelectric generators. Elsevier, 80(April), 110-116. Retrieved from http://www.sciencedirect.com/science/article/pii/S0196890414000533?np=y&npKey=f8ddac527494d1c93ec47a5028012af34400722615c5c2c950bdab1fa0674afb.*
(Continued)

*Primary Examiner* — Kevin A Lathers
(74) *Attorney, Agent, or Firm* — Robert L. Stearns; Dickinson Wright, PLLC (57) ABSTRACT

A piston assembly for monitoring at least one operating condition of an internal combustion engine and/or piston during use of the piston in the engine, for example during an engine test, is provided. The piston assembly includes an electronic instrumentation unit coupled to the piston for collecting data related to the operating conditions. Instead of a battery or wireless power transfer system, the piston assembly includes a thermoelectric module to provide energy to the electronic instrumentation unit. One side of the thermoelectric module is coupled to an undercrown surface of the piston, which is typically hot due its proximity to the combustion chamber. The opposite side of the thermoelectric module is cooled by a cooling fluid, such as a spray of cooling oil. The temperature flux at the thermoelectric
(Continued)

module is converted into electrical energy and used to power the electronic instrumentation unit.

27 Claims, 3 Drawing Sheets (51) Int. Cl.
    *H01L 35/02* (2006.01)
    *F02F 3/00* (2006.01)
    *G01K 13/06* (2006.01)
    *H01L 35/30* (2006.01)

(52) U.S. Cl.
    CPC .............. *H01L 35/30* (2013.01); *H01L 35/32* (2013.01); *G01K 2215/00* (2013.01)

(56) References Cited

U.S. PATENT DOCUMENTS

| | | | |
|---|---|---|---|
| 7,287,506 B1 | 10/2007 | Reiners et al. | |
| 7,739,994 B2 | 6/2010 | Mcgilvray et al. | |
| 8,844,341 B2 | 9/2014 | Miller | |
| 2001/0035139 A1* | 11/2001 | Lash | F01P 3/08 123/41.35 |
| 2003/0221639 A1* | 12/2003 | Weng | F01P 3/08 123/41.35 |
| 2006/0137627 A1* | 6/2006 | Kim | G01K 1/026 123/41.05 |
| 2010/0258064 A1* | 10/2010 | Rebello | F02F 3/22 123/41.35 |
| 2013/0298642 A1 | 11/2013 | Gillette, II | |
| 2013/0298652 A1 | 11/2013 | Gillette, II | |
| 2013/0298664 A1 | 11/2013 | Gillette, II | |
| 2013/0298857 A1 | 11/2013 | Gillette, II | |
| 2013/0299000 A1 | 11/2013 | Gillette, II | |
| 2013/0299001 A1 | 11/2013 | Gillette | |
| 2013/0300341 A1 | 11/2013 | Gillette | |
| 2013/0300574 A1 | 11/2013 | Gillette, II | |
| 2013/0301674 A1 | 11/2013 | Gillette, II | |
| 2013/0304346 A1 | 11/2013 | Gillette, II | |
| 2013/0304351 A1 | 11/2013 | Gillette, II | |
| 2014/0046494 A1* | 2/2014 | McAlister | G06F 1/26 700/287 |
| 2014/0174395 A1* | 6/2014 | Richerson | F02F 3/00 123/193.6 |

FOREIGN PATENT DOCUMENTS

| | | | |
|---|---|---|---|
| JP | 2006266211 A | | 10/2006 |
| JP | 2007-77951 A | * | 3/2007 |
| JP | 2007077951 | | 3/2007 |
| JP | 2012168813 A | | 9/2012 |
| WO | 03065326 A2 | | 8/2003 |
| WO | 2012079759 A1 | | 6/2012 |
| WO | WO 2012/079759 A1 | * | 6/2012 ............ F02B 77/089 |

OTHER PUBLICATIONS

International Search Report, dated Sep. 16, 2015 (PCT/US2015/038773).

* cited by examiner

POWER GENERATOR FOR PISTON INSTRUMENTATION

CROSS REFERENCE TO RELATED APPLICATIONS

This U.S. patent application claims the benefit of U.S. provisional patent application Ser. No. 62/072,520 filed Oct. 30, 2014, the entire content of which is incorporated herein by reference.

BACKGROUND OF THE INVENTION

1. Field of the Invention

This invention relates generally to systems for monitoring piston conditions during engine testing, and more specifically to systems for providing energy to devices which monitor the piston conditions in the engine.

2. Related Art

Manufacturers of internal combustion engines typically run tests simulating operation of the engine before bringing the engine to market. Each component of the engine is evaluated for performance and durability purposes. Such tests include running the engine for long durations of time, for example multiple weeks or months, and monitoring the performance of the engine components throughout the entire test duration. For example, the piston should be monitored to confirm that the piston and engine maintain an acceptable operating temperature throughout the entire test duration.

However, evaluating the internal engine components, such as the piston, is typically very difficult since these components are not readily accessible and operate in extreme environments. To properly evaluate such components, many engine manufacturers will make substantial changes to the engine block to accommodate various linkages and transmitting systems. Such modifications are not only costly and time consuming but also undesirable because the engines being tested are in high demand and are costly to produce, especially during the very early development phase.

Another approach some engine manufacturers use is to attach electronic instrumentation, such as a data collector assembly, with a wireless transmitter/receiver to the engine component. In addition to the wireless transmitter, such data collector assemblies typically include a battery, a plurality of sensors, at least one processor, and a buffer memory which is configured to only store data until the data is transmitted via the wireless transmitter to a remote computer. Shortly before the engine test begins, a person must manually activate the data collector assembly. During the engine test, a substantial amount of the electrical power from the battery is used by the wireless transmitter/receiver to transmit the data to the remote computer.

Yet another system and method used to monitor engine components, such as the piston, is disclosed in U.S. Pat. No. 8,843,341 to Federal-Mogul Corporation. This system includes a data collector assembly for collecting and storing data related to at least one condition of the piston during an engine test. The data collector assembly also includes a sensor for sensing a condition of the internal engine component and for generating a signal corresponding to the sensed condition, and an analog to digital converter for converting the signal into a digital signal. The data collector assembly also includes a memory for storing data and a clock. The data collector assembly additionally includes a processor which is in electrical communication with the analog to digital converter, the memory and the clock. The processor is configured to process the digital signal and store data corresponding to the digital signal on the memory. At least one power source, such as a battery, is electrically connected to the sensor, the analog to digital converter, the memory, the processor and the clock. During the engine test, the sensor, the analog to digital converter, the memory, the processor and the clock are configured to be substantially the only devices that draw electricity from the power source. This data collector assembly is advantageous as compared to other known data collector assemblies used to monitor engine components because it lacks a power hogging wireless transmitter/receiver, thereby allowing for a smaller power source to be employed. In addition to providing for packaging advantages, the smaller power source, such as the battery, is typically more reliable than larger power sources when operating in extreme environments, such as those found within an internal combustion engine.

Although the system disclosed in U.S. Pat. No. 8,843,341 has numerous advantages, the size of the battery used to provide power to the data collector assembly typically limits the engine test duration. As an alternative to the battery, a wireless power transfer system could be used to provide power to the data collector assembly. However, such wireless transfer systems require significant and costly modifications to the engine block, which is not desirable to engine manufacturers.

SUMMARY OF THE INVENTION

One aspect of the invention provides an improved piston assembly for monitoring at least one operating condition of a piston and/or an internal combustion engine while using the piston in the engine. The piston includes a combustion bowl surface for exposure to heat from a combustion chamber of the engine, and an undercrown surface facing opposite the combustion bowl surface for exposure to a cooling medium. An electronic instrumentation unit is coupled to the piston for monitoring the at least one condition of the piston and/or the engine. A thermoelectric module is coupled to the electronic instrumentation unit and the undercrown surface of the piston for exposure to the cooling medium and the heat from the combustion chamber. The thermoelectric module converts a temperature difference between the cooling medium and the heat from the combustion chamber into energy and transfers the energy to the electronic instrumentation unit.

Another aspect of the invention provides a system for monitoring at least one condition of a piston and/or internal combustion engine during use of the piston in the engine. The system includes an electronic instrumentation unit for being coupled to a piston and monitoring the at least one condition of the piston and/or the engine. A thermoelectric module is coupled to the electronic instrumentation unit for being coupled to the piston and for converting a temperature difference between a cooling fluid and heat from a combustion chamber into energy and transferring the energy to the electronic instrumentation unit.

Yet another aspect of the invention provides a method for monitoring at least one condition of a piston and/or internal combustion engine during use of the piston in the engine. The method includes providing a piston assembly including a piston. The piston includes a combustion bowl surface and an undercrown surface facing opposite the combustion bowl surface. The piston assembly also includes an electronic instrumentation unit coupled to the piston for monitoring the at least one condition of the piston and/or engine, and a thermoelectric module coupled to the electronic instrumentation unit and the undercrown surface of the piston. The method further includes exposing the combustion bowl surface to heat from the combustion chamber of the internal combustion engine; applying a cooling medium to the thermoelectric module; converting a temperature difference between the cooling medium and the heat from the combustion chamber into energy using the thermoelectric module; and transferring the energy from the thermoelectric module to the electronic instrumentation unit.

Numerous advantages are provided by the piston assembly, system and method of the present invention. Since portions of the piston are continuously heated by the combustion chamber while other portions are continuously sprayed with cooling fluid, the thermoelectric module is able to use the constant heat flux to provide electrical energy to the electronic instrumentation unit throughout the entirety of an engine test duration. The test duration is no longer limited by the amount of available energy. In addition, the thermoelectric module is a solid state design having a durable construction, and no moving parts or components external to the piston are required. Thus, the thermoelectric module allows for operation at much faster engine speeds and higher temperatures. Furthermore, the dimensions, mass, and location of the thermoelectric module can be selected so that the thermoelectric module does not interfere with or hinder the operation of the piston or engine being tested.

BRIEF DESCRIPTION OF THE DRAWINGS

Other advantages of the present invention will be readily appreciated, as the same becomes better understood by reference to the following detailed description when considered in connection with the accompanying drawings wherein.

DESCRIPTION OF AN ENABLING EMBODIMENT

The invention provides an improved assembly for monitoring at least one engine operating condition, such as temperature of a piston 20, during use of the piston 20 in the internal combustion engine. Typically, the assembly is used in a test engine operated by an engine manufacturer, so that the manufacturer can evaluate the performance and durability of the piston 20, before bringing the engine to market. The assembly includes an electronic instrumentation unit 22 for monitoring the operating conditions of the engine and/or piston 20, and a thermoelectric module 24 for providing electrical energy to the electronic instrumentation unit 22 throughout the entire engine test.

Any type of piston 20 can be monitored using the assembly of the present invention. In the example embodiment shown in FIGS. 1-3, the piston 20 comprises a single-piece cast design including a crown portion 26 presenting a combustion bowl surface 28 and an oppositely facing undercrown surface 30. During engine operation, the combustion bowl surface 28 is directly exposed to high temperature gases in a combustion chamber, and heat from the combustion chamber travels through the crown portion 26 to the undercrown surface 30. To reduce the temperature of the crown portion 26, a cooling medium supply 56 provides a cooling medium 32 to the undercrown surface 30. In the example embodiment, the cooling medium supply is a nozzle, and the cooling medium 32 is a liquid, such as cooling oil, which is continuously sprayed onto the undercrown surface 30. The crown portion 26 also includes a ring belt 34 including plurality of ring grooves 36 for maintaining piston rings (not shown).

Figure 1:
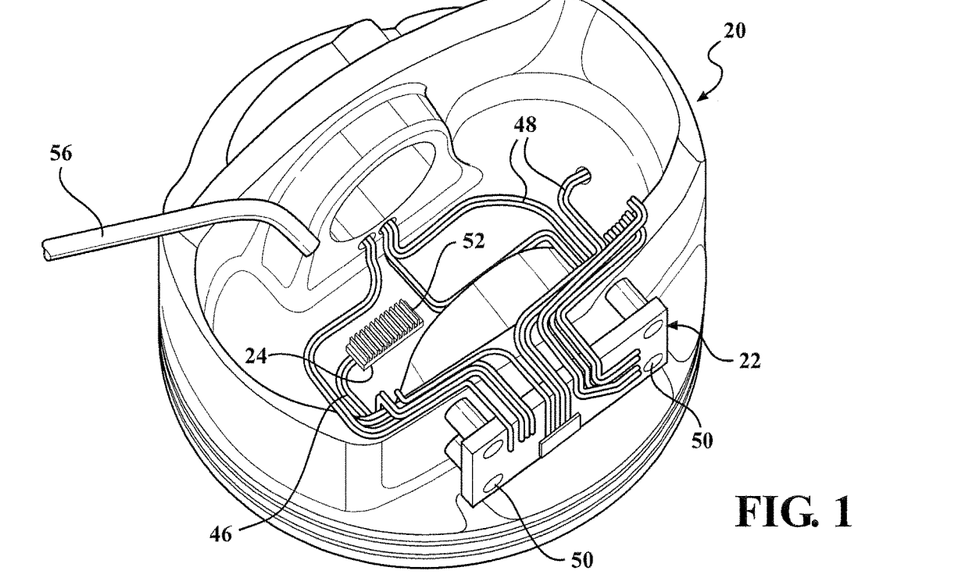
FIG. 1 is a perspective view of an improved monitoring assembly including an electronic instrumentation unit and a thermoelectric module coupled to a piston according to an example embodiment of the invention.
Figure 2:
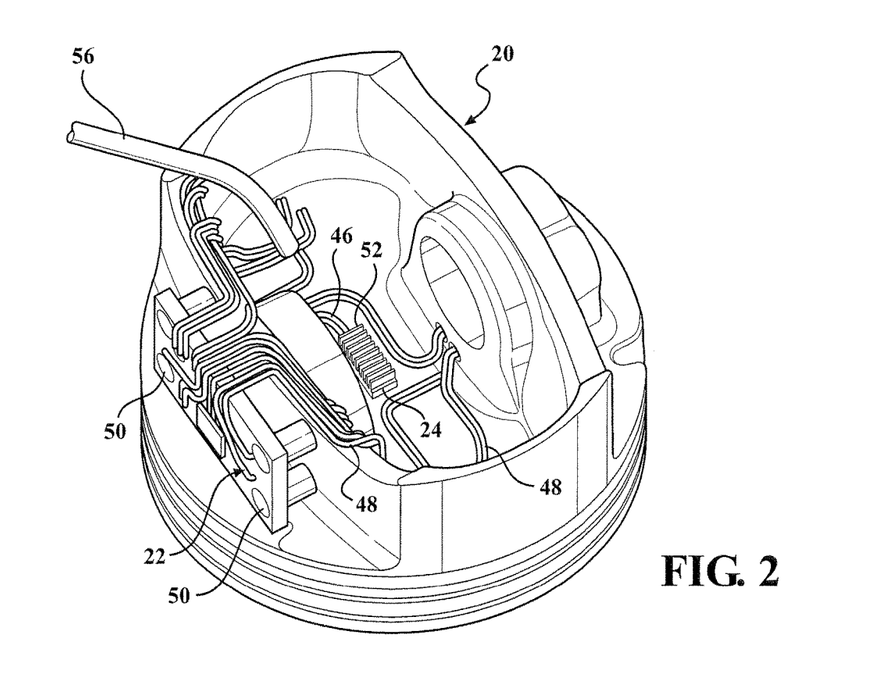
FIG. 2 is another perspective view of the improved monitoring assembly coupled to the piston according to the example embodiment.
Figure 3:
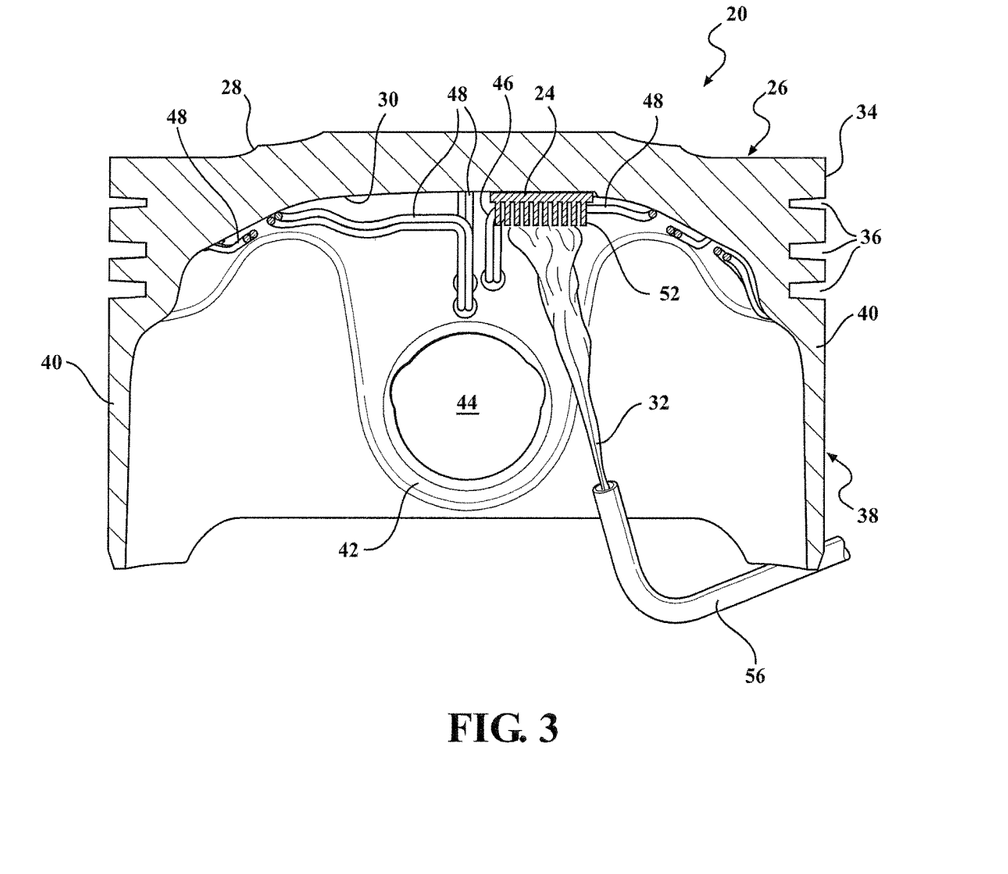
FIG. 3 is a cross-sectional view of the piston of the example embodiment showing cooling oil being sprayed onto the thermoelectric module.

The piston 20 further includes a lower portion 38 depending from the ring belt 34. The lower portion 38 includes a pair of skirt sections 40 spaced from one another by pin bosses 42. Each pin boss 42 defines a pin bore 44 for receiving a wrist pin (not shown) which is coupled to a connecting rod (not shown). Although the piston 20 of FIGS. 1-3 is a single-piece cast design, the piston 20 can comprise other designs. For example, the crown portion 26 and the lower portion 38 could be welded or otherwise connected together.

As shown in FIGS. 1-3, the thermoelectric module 24, also referred to as a thermoelectric generator, is thermally coupled to a portion of the piston 20 exposed to a temperature flux, which can be any portion of the piston 20 that provides heat and is also exposed to a cooling medium, such as the cooling fluid 32. In the example embodiment, the thermoelectric module 24 is coupled to the undercrown surface 30 along a center axis of the piston 20. Thus, heat from the combustion chamber travels through the crown portion 26 to the thermoelectric module 24, while the cooling fluid 32 is sprayed onto the undercrown surface 30 and also onto the thermoelectric module 24, as shown in FIG. 3. The thermoelectric module 24 converts this temperature difference directly into electric energy according to a phenomenon known as the Seebeck effect, or thermoelectric effect. The temperature difference at the thermoelectric module 24 is present throughout the entire engine test, no matter how long the duration of the test. Thus, the thermoelectric module 24 is able to generate electrical energy throughout the entire duration of the test, and the duration of the test is not limited by the amount of energy available for the electronic instrumentation unit 22.

Various different types of thermoelectric modules 24 can be employed. In the example embodiment, the dimensions and mass of the thermoelectric module 24 are selected such that the thermoelectric module 24 does not hinder the operation of the piston 20 or performance of the internal combustion engine being tested. Also, in the example embodiment, the thermoelectric module 24 is conveniently located at the center axis and along the undercrown surface 30 of the piston 20. Thus, the thermoelectric module 24 allows the piston 20 to stay axially balanced and does not interfere with the wrist pin or connecting rod. In addition, various different methods can be used to couple the thermoelectric module 24 to the piston 20. However, in each case, the thermoelectric module 24 should be thermally coupled, so that the thermoelectric module 24 is not insulated, and so that heat from the piston 20 is not lost. In the example embodiment, the thermoelectric module 24 is coupled to the piston 20 using a thermally conductive epoxy to keep the temperature of the thermoelectric module 24 at or close to the temperature of the undercrown surface 30 of the piston 20. In addition, although not shown, the assembly could include a plurality of the thermoelectric modules 24 connected in series. The assembly could also include a least one other type of power source, for example a battery, in addition to the thermoelectric module 24.

The thermoelectric module 24 is electrically connected to the electronic instrumentation unit 22, and the electrical energy provided by the thermoelectric module 24 is transferred to the electronic instrumentation unit 22 to power the electronic instrumentation unit 22 throughout the entire engine test. In the example embodiment, the thermoelectric module 24 is electrically connected to the electronic instrumentation unit 22 by a plurality of wires 46, which are attached to the piston 20 with epoxy or glue and conveniently located so as to not interfere with the performance of the piston 20. Since the temperature flux at the thermoelectric module 24 is present throughout the entire duration of the engine test, the electrical energy can also be supplied to the electronic instrumentation unit 22 throughout the entire duration of the test.

The electronic instrumentation unit 22 can comprise various different designs which are capable of monitoring at least one condition of the piston 20 and/or the engine. The electronic instrumentation unit 22 includes a ground and a power input for receiving the energy from the thermoelectric module 24, typically via the wires 46. The electronic instrumentation unit 22 also includes a data collector for sensing at least one condition of the piston 20 and/or the piston, such as the temperature of the piston, storing the data, and transmitting the data to an external computer for analysis by the engine manufacturer. An example data collector is described in U.S. Pat. No. 8,843,341, which is incorporated herein by reference in its entirely.

In the example embodiment shown in FIGS. 1-3, the electronic instrumentation unit 22 is connected to a plurality of thermocouples 48 disposed at various locations on the piston 20 to measure the temperature at the various locations. The thermocouples 48 provide the temperature of the piston 20 at the various locations to the electronic instrumentation unit 22. The electronic instrumentation unit 22 of the example embodiment is also provided in the form of a board mounted outwardly of one of the pin bosses 42 of the piston 20. Holes are drilled through the board and piston 20, and fasteners, such as standoff cylinders 50 are inserted through the holes to secure the board to the piston 20. However, the electronic instrumentation unit 22 could alternatively include multiple boards, could be located along another portion of the piston 20, and could be coupled to the piston 20 using other methods. In the example embodiment, the electronic instrumentation unit 22 also includes a memory for storing the data, a processor, and a radio for transmitting the data to an external computer for evaluation by the engine manufacturer.

Figure 4:
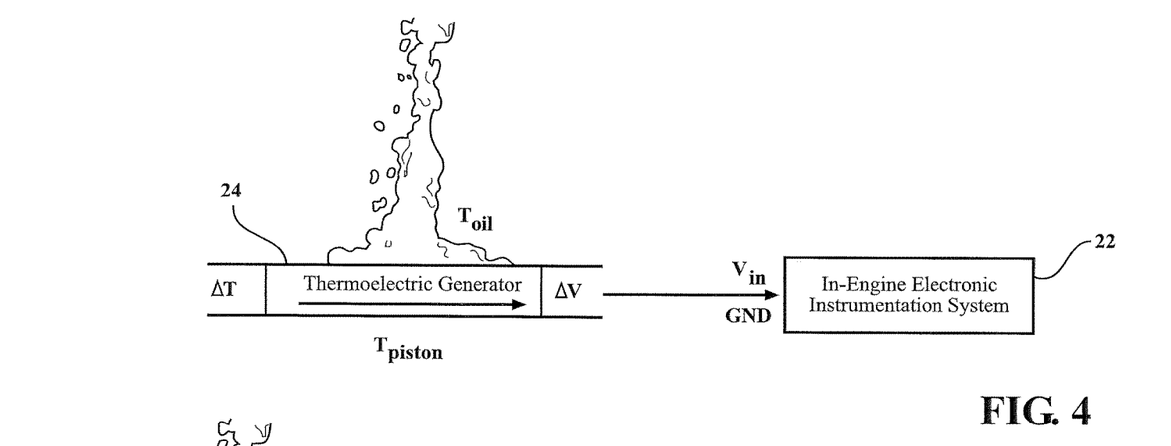
FIG. 4 illustrates transferring electrical energy from the thermoelectric module to the electronic instrumentation unit according to one example embodiment.
Figure 5:
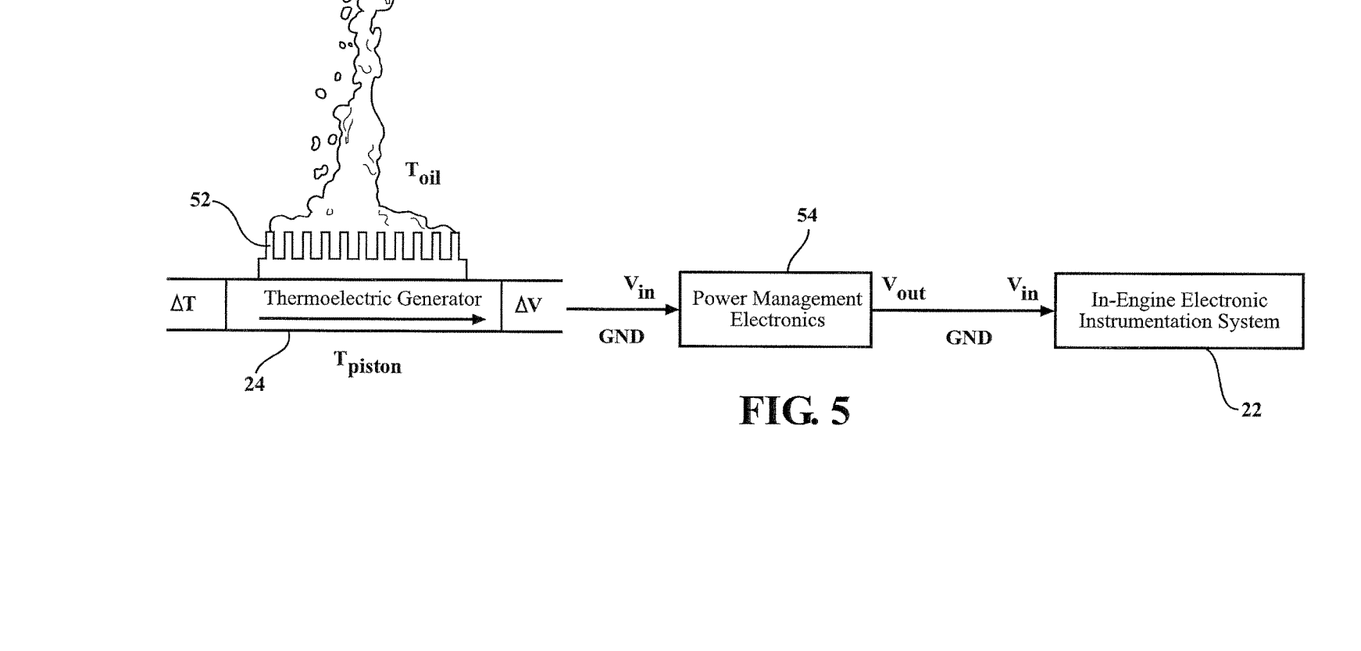
FIG. 5 illustrates transferring electrical energy from the thermoelectric module to the electronic instrumentation unit according to another example embodiment.

FIGS. 4 and 5 illustrate two example embodiments for generating and transferring the electric energy from the thermoelectric module 24 to the electronic instrumentation unit 22. FIG. 4 shows a first embodiment wherein one side of the thermoelectric module 24 is in direct contact with the heated piston 20, and the other side is in direct contact with the spray of cooling fluid 32. In addition, each side of the thermoelectric module 24 is in electrical contact with the power and ground of the electronic instrumentation unit 22. The thermoelectric module 24 converts the temperature difference ($\Delta T$) between the heated piston 20 and the cooling fluid 32 to electrical energy ($\Delta V$), and then transmits the electrical energy directly to the electronic instrumentation unit 22.

FIG. 5 shows a second embodiment for generating and transferring the electric energy from the thermoelectric module 24 to the electronic instrumentation unit 22. In this embodiment, one side of the thermoelectric module 24 is still in direct contact with the heated piston 20. However, the opposite side of the thermoelectric module 24 is connected to a separate heat sink 52, and the heat sink 52 is in direct contact with the spray of cooling fluid 32. The thermoelectric module 24 converts the temperature difference ($\Delta T$) between the heated piston 20 and the heat sink 52 to electrical energy ($\Delta V$).

Also in the embodiment of FIG. 5, power management electronics 54 are disposed between the thermoelectric module 24 and the electronic instrumentation unit 22, and each side of the thermoelectric module 24 is in electrical contact with the power and ground of the power management electronics 54. Thus, instead of transmitting the electrical energy directly to the electronic instrumentation unit 22, the thermoelectric module 24 transmits the electrical energy to the power and ground of the power management electronics 54. The power management electronics 54 is typically used in cases where the electrical energy ($\Delta V$) provided by the thermoelectric module 24 is not sufficient or is not in the form required by the electronic instrumentation unit 22. For example, the power management electronics 54 can increase the voltage and reduce the current prior to transmitting the electrical energy to the electronic instrumentation unit 22. Various different types of power management electronics 54 can be used. In the example embodiment, however, the power management electronics 54 includes a DC-DC converter which boosts the voltage, such that the voltage provided to the electronic instrumentation unit 22 is at the preferred level of 2 to 5 volts.

Another aspect of the invention provides an improved system for monitoring the at least one condition of the piston 20 and/or the engine during use in the internal combustion engine. The system includes the electronic instrumentation unit 22, the thermoelectric module 24, the optional heat sink 52, and the optional power management electronics 54 described above. The system also includes the cooling medium supply 56 for providing the cooling medium 32 to the undercrown surface 30 and the thermoelectric module 24.

Yet another aspect of the invention provides an improved method for monitoring the at least one condition of the piston 20 and/or the engine during use in the internal combustion engine using the electronic instrumentation unit 22, the thermoelectric module 24, the optional heat sink 52, and the optional power management electronics 54 described above.

The method first includes providing the piston assembly, which preferably includes disposing the thermoelectric module 24 at the center axis of the piston 20. The method then includes exposing the combustion bowl surface 28 to heat from the combustion chamber of the engine; and applying the cooling medium 32 to the thermoelectric module 24, for example by spraying a cooling fluid toward the thermoelectric module 24 and the undercrown surface 30. The step of applying the cooling medium 32 to the thermoelectric module 24 can also include applying the cooling medium 32 to the heat sink 52.

The method further includes converting the temperature difference between the cooling medium 32 and the heat from the combustion chamber into energy using the thermoelectric module 24; and transferring the energy from the thermoelectric module 24 to the electronic instrumentation unit 22. In one embodiment, the method includes adjusting the energy before transferring the energy from the thermoelectric module 24 to the electronic instrumentation unit 22 using the power management electronics 54. Finally, the method includes collecting the data about the at least one condition of the piston 20 and/or the engine using the electronic instrumentation unit 22 and the energy provided by the thermoelectric module 24.

Obviously, many modifications and variations of the present invention are possible in light of the above teachings and may be practiced otherwise than as specifically described while within the scope of the following claims.

What is claimed is:

1. A piston assembly, comprising:
   a piston including a combustion surface for exposure to heat from a combustion chamber of an internal combustion engine;
   said piston including an undercrown surface spaced from said combustion surface for exposure to a cooling medium;
   an electronic instrumentation unit coupled to said piston;
   at least one sensor for sensing at least one condition of said piston and/or the engine, said at least one sensor being coupled to said electronic instrumentation unit for providing the at least one condition to said electronic instrumentation unit; and
   a thermoelectric module coupled to said undercrown surface of said piston for receiving the heat from the combustion chamber, a portion of said thermoelectric module being exposed for contact by the cooling medium, said thermoelectric module being electrically connected to a power input of said electronic instrumentation unit, wherein said thermoelectric module converts a temperature difference between the cooling medium and the heat from the combustion chamber into energy and transfers the energy to said power input of said electronic instrumentation unit, and said electronic instrumentation unit uses the energy received from said thermoelectric module to store and/or transmit to a computer the at least one condition of said piston and/or the engine.

2. The piston assembly of claim 1, wherein said thermoelectric module is disposed along a center axis of said piston.

3. The piston assembly of claim 1 further including a cooling medium supply for providing the cooling medium to said undercrown surface and said thermoelectric module.

4. The piston assembly of claim 3, wherein said cooling medium supply is a nozzle and said cooling medium is a spray of cooling fluid.

5. The piston assembly of claim 1 further including power management electronics disposed between said thermoelectric module and said electronic instrumentation unit for receiving the energy from said thermoelectric module and adjusting the energy before transmitting the energy from said thermoelectric module to said electronic instrumentation unit.

6. The piston assembly of claim 1 including a power source separate from said thermoelectric module coupled to said electronic instrumentation unit for providing additional energy to said electronic instrumentation unit.

7. The piston assembly of claim 1, wherein said at least one sensor includes a plurality of thermocouples disposed at a plurality of locations along said piston for measuring the temperature of said piston at each of the locations; and each of said thermocouples being coupled to said electronic instrumentation unit for providing the temperature at each of the locations to said electronic instrumentation unit.

8. The piston assembly of claim 1, wherein said piston includes a crown portion presenting said combustion surface and said undercrown surface;
   said combustion surface includes a bowl;
   said crown portion includes a plurality of ring grooves for maintaining piston rings;
   said piston includes a pair of skirt sections spaced from one another by pin bosses, wherein said pin bosses define a pin bore for receiving a wrist pin;
   said electronic instrumentation unit is mounted with fasteners on one of said pin bosses of said piston;
   said electronic instrumentation unit includes a ground and said power input for receiving the energy from said thermoelectric module;
   said electronic instrumentation unit includes a data collector for obtaining the at least one condition of said piston or the engine, storing data about the at least one condition, and transmitting the data to a computer;
   said electronic instrumentation unit includes a memory for storing the data, a processor, and a radio for transmitting the data to the computer;
   said thermoelectric module is thermally coupled to said undercrown surface at a center axis of said piston by a thermally conductive epoxy; and
   said at least one sensor includes a plurality of thermocouples disposed at a plurality of locations along said piston for measuring the temperature of said piston at each of the locations;
   each of said thermocouples being coupled to said electronic instrumentation unit for providing the temperature at each of the locations to said electronic instrumentation unit;
   a power management electronics disposed between said thermoelectric module and said electronic instrumentation unit for receiving the energy from said thermoelectric module and adjusting the energy before transmitting the energy from said thermoelectric module to said electronic instrumentation unit; and
   a cooling medium supply disposed adjacent said piston for providing the cooling medium to said undercrown surface and said heat sink and said thermoelectric module, wherein said cooling medium supply is a nozzle, and said cooling medium is a spray of cooling oil.

9. The piston assembly of claim 1, wherein said piston comprises a crown portion presenting said combustion surface and said undercrown surface, said crown portion includes a plurality of ring grooves;
   said piston includes a lower portion depending from said ring belt, said lower portion includes a pair of skirt sections spaced from one another by pin bosses, wherein said pin bosses define a pin bore;
   said piston extends longitudinally from said crown portion to said lower portion; and
   said thermoelectric module is disposed on said undercrown surface radially inwardly of said ring grooves and longitudinally between said combustion bowl surface and said lower portion.

10. A piston assembly, comprising:
    a piston including a combustion surface for exposure to heat from a combustion chamber of an internal combustion engine;

said piston including an undercrown surface spaced from said combustion surface for exposure to a cooling medium;
an electronic instrumentation unit coupled to said piston;
at least one sensor for sensing at least one condition of said piston and/or the engine, said at least one sensor being coupled to said electronic instrumentation unit for providing the at least one condition to said electronic instrumentation unit; and
a thermoelectric module coupled to said undercrown surface of said piston for receiving the heat from the combustion chamber, said thermoelectric module being electrically connected to a power input of said electronic instrumentation unit,
a heat sink disposed on a surface of said thermoelectric module opposite said undercrown surface for exposure to the cooling medium;
wherein said thermoelectric module converts a temperature difference into energy and transfers the energy to said power input of said electronic instrumentation unit, and said electronic instrumentation unit uses the energy received from said thermoelectric module to store and/or transmit to a computer the at least one condition of said piston and/or the engine.

11. A system for monitoring at least one condition of a piston and/or internal combustion engine during use of the piston in the engine, comprising:
an electronic instrumentation unit for being coupled to a piston;
at least one sensor for sensing at least one condition of said piston and/or the engine, said at least one sensor being coupled to said electronic instrumentation unit for providing the at least one condition to said electronic instrumentation unit; and
a thermoelectric module connected to a power input of said electronic instrumentation unit and for being coupled to the piston and for converting a temperature difference between a cooling fluid and heat from a combustion chamber into energy and transferring the energy to said power input of the electronic instrumentation unit, such that said electronic instrumentation unit can the energy received from said thermoelectric module to store and/or transmit to a computer the at least one condition of said piston and/or the engine.

12. The system of claim 11 including said piston, wherein the thermoelectric module is coupled to an undercrown surface of said piston and is disposed along a center axis of the piston.

13. The system of claim 12 including a cooling medium supply for providing the cooling medium to the undercrown surface and the thermoelectric module.

14. The system of claim 12 including a heat sink coupled to the thermoelectric module opposite the undercrown surface for exposure to the cooling medium.

15. The system of claim 11 including power management electronics disposed between the thermoelectric module and the electronic instrumentation unit for receiving the energy from the thermoelectric module and adjusting the energy before transmitting the energy from the thermoelectric module to the electronic instrumentation unit.

16. A method for monitoring at least one condition of a piston and/or internal combustion engine during use of the piston in the engine, comprising the steps of:
providing a piston assembly including a piston, the piston including a combustion surface and an undercrown surface spaced from the combustion surface, the piston assembly including an electronic instrumentation unit coupled to the piston, the piston assembly including a thermoelectric module coupled to the undercrown surface of the piston, the thermoelectric module electrically connected to a power input of the electronic instrumentation unit, and the piston assembly including at least one sensor coupled to said electronic instrumentation unit;
sensing at least one condition of the piston and/or the engine using the at least one sensor and providing the at least one condition to the electronic instrumentation unit;
exposing the combustion surface to heat from the combustion chamber of the internal combustion engine;
applying a cooling medium to the thermoelectric module;
converting a temperature difference between the cooling medium and the heat from the combustion chamber into energy using the thermoelectric module;
transferring the energy from the thermoelectric module to the power input of the electronic instrumentation unit; and
storing and/or transmitting to a computer the at least one condition of the piston and/or the engine using the electronic instrumentation unit, wherein the electronic instrumentation unit uses the energy received from the thermoelectric module to store and/or transmit the at least one condition of the piston and/or the engine.

17. The method of claim 16, wherein the step of providing the piston assembly includes disposing the thermoelectric module at a center axis of the piston.

18. The method of claim 16, wherein the step of applying the cooling medium to the thermoelectric module includes spraying a cooling fluid toward the thermoelectric module and the undercrown surface.

19. The method of claim 16, including adjusting the energy before transferring the energy from the thermoelectric module to the electronic instrumentation unit using power management electronics.

20. The method of claim 16, including collecting data about the at least one condition of the piston and/or the engine using the electronic instrumentation unit and the energy provided by the thermoelectric module.

21. A method for monitoring at least one condition of a piston and/or internal combustion engine during use of the piston in the engine, comprising the steps of:
providing a piston assembly including a piston, the piston including a combustion surface and an undercrown surface spaced from the combustion surface, the piston assembly including an electronic instrumentation unit coupled to the piston, the piston assembly including a thermoelectric module coupled to the undercrown surface of the piston, the thermoelectric module electrically connected to a power input of the electronic instrumentation unit, the piston assembly including a heat sink disposed on a surface of the thermoelectric module opposite the undercrown surface, and the piston assembly including at least one sensor coupled to the electronic instrumentation unit;
sensing at least one condition of the piston and/or the engine using the at least one sensor and providing the at least one condition to the electronic instrumentation unit;
exposing the combustion surface to heat from the combustion chamber of the internal combustion engine;
applying a cooling medium to the heat sink;
converting a temperature difference into energy using the thermoelectric module;

transferring the energy from the thermoelectric module to the power input of the electronic instrumentation unit; and storing and/or transmitting to a computer at least one condition of the piston and/or the engine using the electronic instrumentation unit, wherein the electronic instrumentation unit uses the energy received from the thermoelectric module to store and/or transmit the at least one condition of the piston and/or the engine.

22. A piston assembly, comprising:
a piston body having an upper combustion surface exposed to the heat of combustion during operation of the piston assembly and causing the piston body to be heated, said piston body including a cooling surface other than said upper combustion surface and which is spaced from said upper combustion surface and exposed to a heat-extracting cooling medium during operation of the piston assembly to extract the heat from the piston body thereby setting up a heat flux at the cooling surface;
at least one sensor mounted at a first location on said piston body for sensing a condition;
an electronic instrumentation unit mounted on said piston body at a second location spaced from said upper combustion surface, said electronic instrumentation unit having at least one sensor input operatively coupled to said at least one sensor for receiving and processing input signals including the condition from said at least one sensor, said electronic instrumentation unit including a power input for receiving power from a source to power said electronic instrumentation unit; and
a thermoelectric module having a first surface and a second surface and operative in response to input of a heat flux between said first and second surfaces to generate electricity, said first surface being mounted against said cooling surface of said piston body to conduct heat from said cooling surface into said thermoelectric device through said first surface, said second surface of thermoelectric device being spaced from said cooling surface and exposed to the cooling medium during operation of the engine to produce the heat flux between the first and second surfaces and generate electricity, and said thermoelectric module being operatively coupled to said power input of said electronic instrumentation unit to serve as said source of power input for said electronic instrumentation unit.

23. The piston assembly of claim 22, wherein said cooling medium includes cooling oil.

24. The piston assembly of claim 22, wherein said cooling medium includes a metallic heat sink fixed on said second surface of said thermoelectric device for extracting heat from said second surface.

25. The piston assembly of claim 24, wherein said cooling medium further includes cooling oil.

26. The piston assembly of claim 22, wherein said upper combustion surface includes a bowl, said piston body includes a crown presenting said upper combustion surface, and piston body includes a skirt depending from said crown, said cooling surface is an undercrown surface of said crown facing opposite said upper combustion surface, said at least one sensor includes a plurality of thermocouples disposed along said undercrown surface, said electronic instrumentation unit is mounted on an interior surface of said skirt, and said thermoelectric module is disposed on said undercrown surface.

27. An engine, comprising:
a combustion chamber;
a piston assembly disposed in said combustion chamber;
said piston assembly including a piston body, said piston body including a combustion surface for exposure to heat from said combustion chamber;
said piston body including an undercrown surface spaced from said combustion surface for exposure to a cooling medium;
an electronic instrumentation unit coupled to said piston;
at least one sensor for sensing at least one condition of said piston and/or said engine, said at least one sensor being coupled to said electronic instrumentation unit for providing the at least one condition to said electronic instrumentation unit; and
a thermoelectric module coupled to said undercrown surface of said piston for receiving the heat from said combustion chamber, a portion of said thermoelectric module being exposed for contact by the cooling medium, said thermoelectric module being electrically connected to a power input of said electronic instrumentation unit, wherein said thermoelectric module converts a temperature difference between the cooling medium and the heat from said combustion chamber into energy and transfers the energy to said power input of said electronic instrumentation unit, and said electronic instrumentation unit uses the energy received from said thermoelectric module to store and/or transmit to a computer the at least one condition of said piston and/or the engine.

* * * * *